(12) United States Patent
Lee

(10) Patent No.: US 7,939,362 B2
(45) Date of Patent: May 10, 2011

(54) IMAGE SENSOR AND METHOD OF FABRICATING THE SAME

(75) Inventor: Yun-Ki Lee, Seoul (KR)

(73) Assignee: Samsung Electronics Cop., Ltd., Suwon-Si (KR)

( * ) Notice: Subject to any disclaimer, the term of this patent is extended or adjusted under 35 U.S.C. 154(b) by 12 days.

(21) Appl. No.: 12/613,930

(22) Filed: Nov. 6, 2009

(65) Prior Publication Data

US 2010/0167456 A1    Jul. 1, 2010

(30) Foreign Application Priority Data

Dec. 26, 2008    (KR) .................. 10-2008-0134597

(51) Int. Cl.
*H01L 21/00*    (2006.01)

(52) U.S. Cl. .................. 438/72; 438/98; 257/E31.119; 257/E31.032; 257/E31.054

(58) Field of Classification Search .................. 438/72, 438/98; 257/E31.119, E31.032, E31.054
See application file for complete search history.

(56) References Cited

FOREIGN PATENT DOCUMENTS

| JP | 2005-191492 | 7/2005 |
| JP | 2005-347707 | 12/2005 |
| JP | 2006-019653 | 1/2006 |

*Primary Examiner* — Thanh V Pham
*Assistant Examiner* — Mark A Laurenzi, III
(74) *Attorney, Agent, or Firm* — F. Chau & Associates, LLC

(57) ABSTRACT

An image sensor and a method of fabricating the same are provided. A pad region is disposed on a substrate. The pad region has a higher concentration of impurity ions than the substrate. The pad region is selectively removed using the substrate as an etch mask, thereby forming a hole. A conductive pad is formed in the hole of the substrate.

7 Claims, 11 Drawing Sheets

IMAGE SENSOR AND METHOD OF FABRICATING THE SAME

CROSS-REFERENCE TO RELATED APPLICATION

This application claims under 35 U.S.C. §119 priority to and the benefit of Korean Patent Application No. 10-2008-0134597, filed on Dec. 26, 2008, the entire contents of which are incorporated by reference herein.

BACKGROUND

1. Technical Field

The present disclosure relates to sensors, and, more particularly, to image sensors and a method of manufacturing the same.

2. Discussion of Related Art

In general, image sensors are semiconductor devices that receive optical signals of an object exposed to light and convert the received optical signals into electrical signals. Each image sensor typically includes a pixel array region and a peripheral circuit region. The optical signals are applied to the pixel array region. The peripheral circuit region typically converts the optical signals into the electrical signals according to sensitivity of the light applied to the pixel array region. Thereby, the image sensors mounted in respective electronic components play an auxiliary role in imaging the object.

The image sensors can be developed for various applications, taking into consideration of production cost for marketability. However, the production cost of the image sensors is directly proportional to high integration and multi-function circumstances. The high integration and multi-function capabilities of the image sensors are typically implemented by repeatedly performing semiconductor fabricating processes on a semiconductor substrate on a semiconductor fabricating line. As such, the production cost of the image sensors is very dependent upon the semiconductor fabricating processes.

SUMMARY

In an exemplary embodiment of the present application's inventive concept, a method of fabricating an image sensor capable of simplifying semiconductor fabricating processes to reduce a fabricating cost, is provided.

An exemplary embodiment also includes an image sensor having improved reliability.

In accordance with an exemplary embodiment a method of fabricating an image sensor includes preparing a semiconductor substrate, the semiconductor substrate having a first substrate and a second substrate stacked sequentially, the first substrate and the second substrate each having conductivity. A pad region is formed on the semiconductor substrate, the pad region being in contact with the first substrate through a predetermined region of the second substrate, and impurity ions of the pad region having a concentration higher than impurity ions of the second substrate. An insulating layer is formed on the semiconductor substrate to cover the pad region. The first substrate is selectively removed from the semiconductor substrate. A pad hole is formed in the second substrate and in the insulating layer such that the pad hole is aligned on the pad region of the second substrate.

The first substrate and the second substrate may include impurity ions which have a conductivity type selected from the same conductivity type and from different conductivity types, and the impurity ions of the first substrate may have a concentration higher than the impurity ions of the second substrate.

The second substrate may include a pixel array region and a peripheral circuit region, both of which have active regions, each of the active regions having a plurality of diffusion layers, each of which has impurity ions, and at least part of the impurity ions is disposed on the pad region. The pad region may be foamed in the peripheral circuit region; and the pixel array region may include at least one photodiode.

Selectively removing the first substrate may include performing a planarization process on the semiconductor substrate to expose the second substrate through different etch rates from each other using concentration magnitude of the impurity ions of the first substrate and the second substrate, the planarization process being performed using one selected from chemical mechanical polishing, etching back, and isotropic etching.

The insulating layer may include at least one conductive interconnection, and forming the pad hole may include wet-etching the pad region using the second substrate as an etch mask and/or an etch buffer layer to form a guide hole exposing the insulating layer, and partially etching the insulating layer using the second substrate as the etch mask to form a connection hole exposing the at least one conductive interconnection.

The method may further include: performing surface-etching treatment on the second substrate, the insulating layer, and the at least one conductive interconnection; forming an anti-reflection layer on the second substrate to conformally cover the pad hole; and forming a diffusion layer of n-type conductivity or p-type conductivity on the second substrate, the insulating layer, and the at least one conductive interconnection to be located under the anti-reflection layer.

The method may still further include: forming an insulating spacer layer on the anti-reflection layer to conformally cover the pad hole; etching the insulating spacer layer and the anti-reflection layer to form an insulating spacer surrounding a sidewall of the pad hole and expose the at least one conductive interconnection; and forming a conductive pad to fill the pad hole and cover the periphery of the pad hole.

In accordance with an exemplary embodiment an image sensor includes an insulating layer having at least one conductive interconnection and a connection hole to expose the conductive interconnection. A substrate is disposed on the insulating layer and having a guide hole aligned with the connection hole. A diffusion layer is disposed on the substrate, on sidewalls of the guide hole and on sidewalls of the connection hole, and under the connection hole. An anti-reflection layer and an insulating spacer are sequentially stacked in the guide connection holes to expose at least one of the diffusion layer and the conductive interconnection. The guide hole and the connection hole constitute a pad hole.

The substrate may include a pixel array region having at least one photodiode and a peripheral circuit region having the pad hole, and the diffusion layer may include impurity ions and may be disposed in the pixel array region and in the peripheral circuit region.

The anti-reflection layer may surround the sidewall of the pad hole, partially cover the bottom of the pad hole, and extend from the pad hole to the pixel array region and to the peripheral circuit region of the substrate. The insulating spacer may be disposed on the sidewall of the pad hole.

The image sensor may further include a conductive pad disposed on the anti-reflection layer around the pad hole and filling the pad hole.

In accordance with an exemplary embodiment an image sensor includes a pixel array region and a peripheral circuit region on a substrate. The pixel array region has a plurality of pixel regions such that light radiated to the pixel regions is convertible from optical signals into electrical signals. The peripheral circuit region surrounds the pixel array region, the peripheral circuit region comprising an optical black region and a peripheral region. The optical black region includes a light shielding layer. The peripheral region has a plurality of pad-forming regions, each pad-forming region having a conductive pad to electrically connect to outside of the image sensor. The substrate is disposed on an insulating layer and has a guide hole aligned with a connection hole in the insulating layer. The insulating layer includes at least one conductive interconnection exposed by the connection hole. A diffusion layer is disposed on the substrate, on sidewalls of the guide hole and the connection hole, and under the connection hole making contact with the at least one conductive interconnection, the guide hole and the connection hole forming a pad hole, the diffusion layer comprising impurity ions and being disposed in the pixel array region and in the peripheral circuit region. An anti-reflection layer and an insulating spacer are stacked in the pad hole. The pixel array region further includes at least one photodiode and the peripheral circuit region includes at least one pad hole. The anti-reflection layer surrounds the sidewall of the at least one pad hole, partially covers the bottom of the at least one pad hole, and extends from the at least one pad hole to the pixel array region and to the peripheral circuit region. The insulating spacer is disposed on the sidewall of the at least one pad hole. The conductive pad is disposed on the anti-reflection layer, around the at least one pad hole, fills the at least one pad hole and contacts the diffusion layer.

BRIEF DESCRIPTION OF THE DRAWINGS

Exemplary embodiments are described in further detail below with reference to the accompanying drawings. It should be understood that various aspects of the drawings may have been exaggerated for clarity.

DETAILED DESCRIPTION OF THE EXEMPLARY EMBODIMENTS

Figure 1:
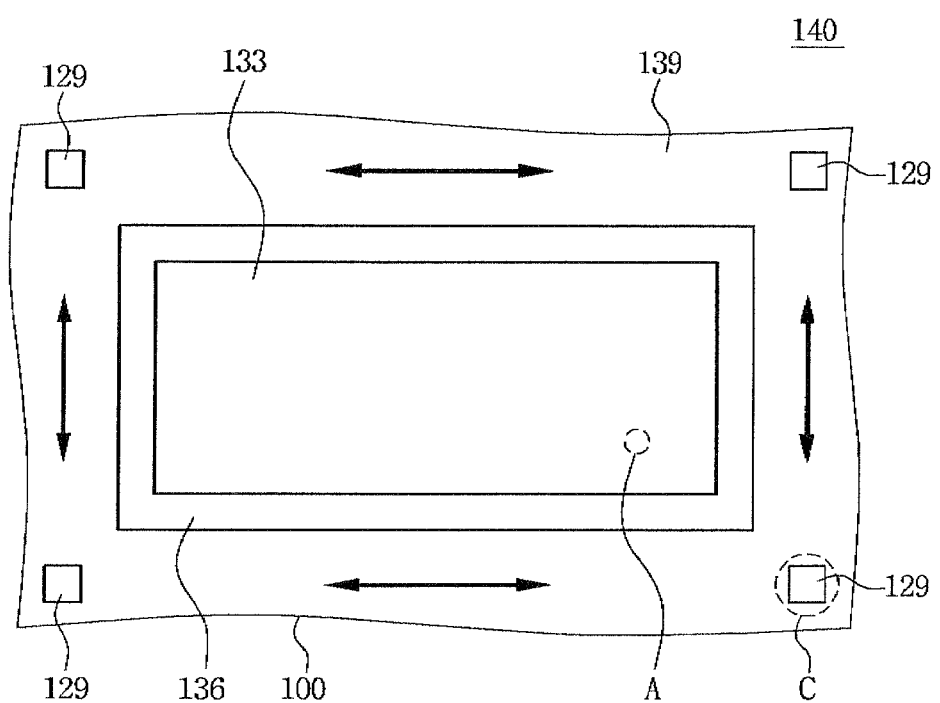
FIG. 1 is a plan view showing an image sensor according to an exemplary embodiment.

Various exemplary embodiments will now be described more fully with reference to the accompanying drawings in which exemplary embodiments are shown. In the drawings, the thicknesses of layers and regions may be exaggerated for clarity.

Detailed illustrative embodiments are disclosed herein. However, specific structural and functional details disclosed herein are merely representative for purposes of describing exemplary embodiments. This invention, however, may be embodied in many alternate forms and should not be construed as limited to only exemplary embodiments set forth herein.

Accordingly, while exemplary embodiments are capable of various modifications and alternative forms, embodiments thereof are shown by way of examples in the drawings and will herein be described in more detail. It should be understood, however, that there is no intent to limit exemplary embodiments to the particular forms disclosed, but on the contrary, exemplary embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, exemplary embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
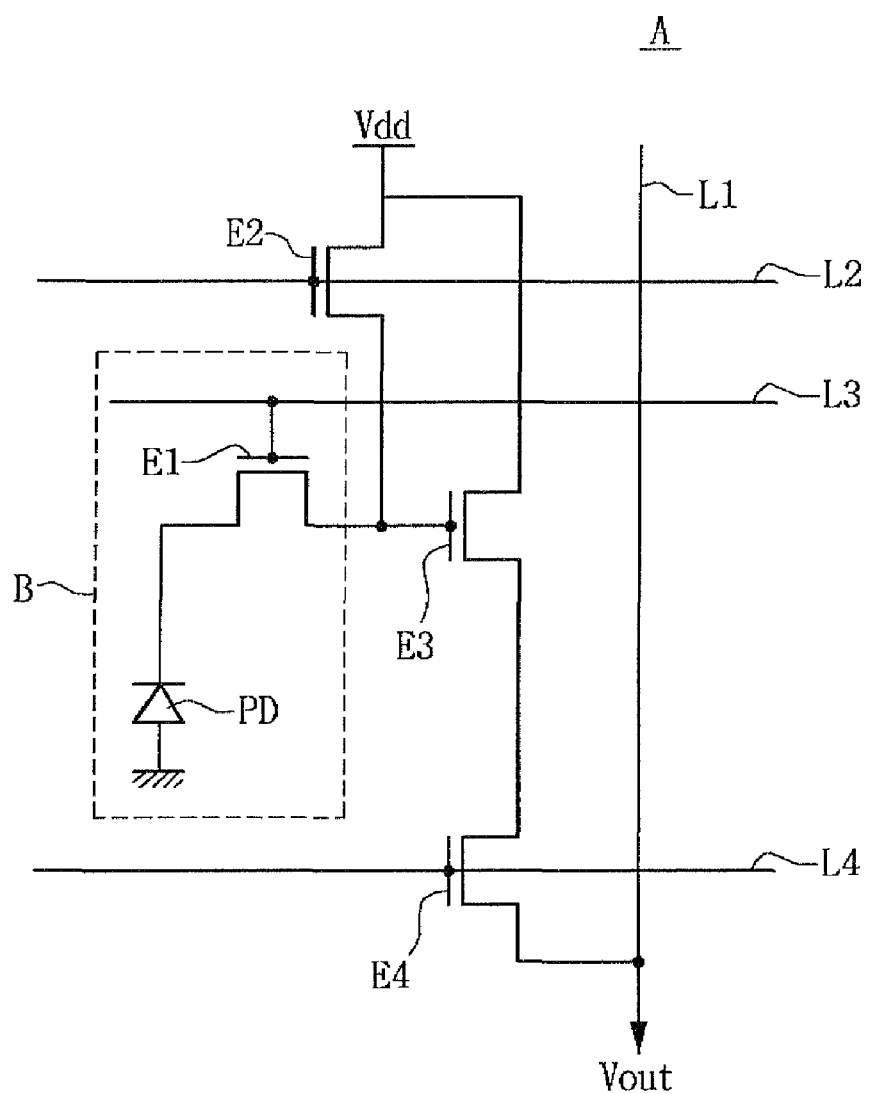
FIG. 2 is a circuit diagram showing a pixel region A of FIG. 1.
Figure 3A:
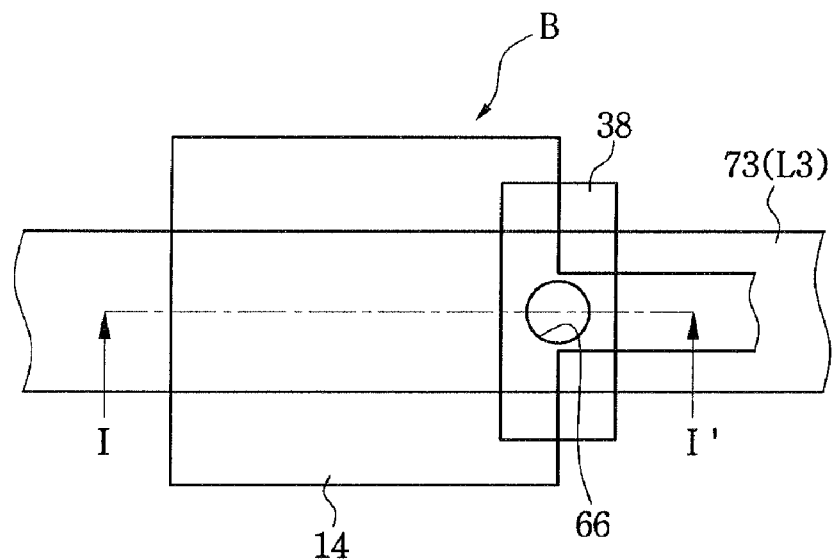
FIG. 3A is a layout showing a region B of FIG. 2.
Figure 3B:
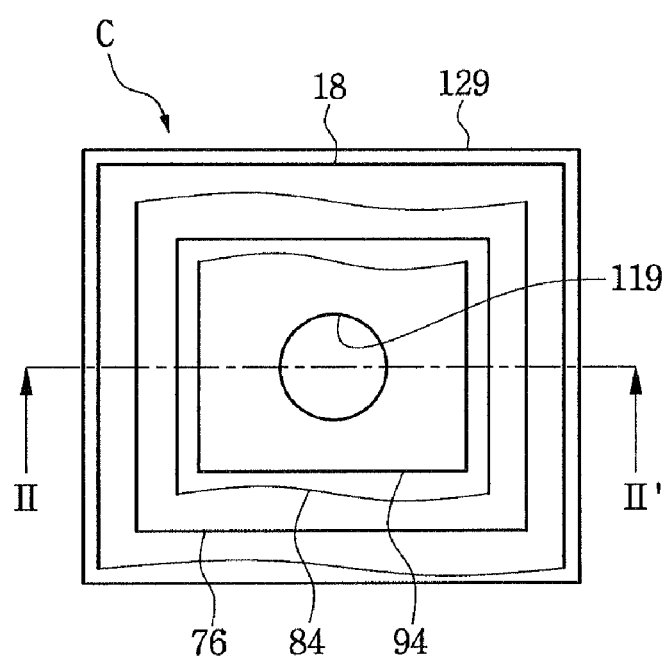
FIG. 3B is a layout showing a region C of FIG. 1.

An image sensor according to an exemplary embodiment will now be described with reference to FIGS. 1, 2, 3A and 3B, wherein FIG. 1 is a plan view showing an image sensor according to an exemplary embodiment, FIG. 2 is a circuit diagram showing a pixel region A of FIG. 1, FIG. 3A is a layout showing a region B of FIG. 2, and FIG. 3B is a layout showing a region C of FIG. 1.

Referring to FIG. 1, an image sensor 140 according to an exemplary embodiment may include a pixel array region 133 and a peripheral circuit region on a support substrate 100. The pixel array region 133 may have a plurality of pixel regions A. The pixel regions A may be arranged two-dimensionally in the pixel array region 133 according to rows and columns of the support substrate 100. Light is radiated to the pixel regions A, so that the pixel regions A can convert optical signals into electrical signals. The pixel array region 133 may include n-type metal oxide semiconductor (nMOS) transistors, or nMOS and p-type metal oxide semiconductor (pMOS) transistors.

The peripheral circuit region may be disposed to surround the pixel array region 133. The peripheral circuit region may include an optical black region 136 and a peripheral region 139. The optical black region 136 may include a plurality of pixel regions A as in the pixel array region 133. The optical black region 136 may have a light shielding layer such that no light is radiated thereto. The optical black region 136 may include nMOS transistors, or nMOS and pMOS transistors.

The peripheral region 139 may have a structure that is different from the pixel array region 133 and the optical black region 136. The peripheral region 139 has internal circuitry (not shown), which may process electrical signals of the pixel array region 133, the optical black region 136, and the peripheral region 139. The peripheral region 139 may include nMOS and pMOS transistors. The peripheral region 139 may have a plurality of pad-forming regions C. Each pad-forming region C may include a conductive pad 129. The conductive pad 129 may electrically connect the pixel array region 133 and the optical black region 136 with the outside through an internal circuit.

Referring to FIG. 2, the pixel region A may include first through fourth transistors E1, E2, E3, E4 that are electrically connected with each other. The first through fourth transistors E1, E2, E3, E4 may be nMOS transistors. The first transistor E1 may have source and drain regions having different volumes. To this end, the first transistor E1 may have a photodiode PD in the source or drain region.

The second, third and fourth transistors E2, E3, E4 may have source and drain regions having substantially the same volume. The first, second and fourth transistors E1, E2, E4 are electrically connected with circuit lines L1, L2, L3, L4 to correspond to the photodiode PD. To simplify description of the embodiments, attention will be paid to a transistor-forming region B related to the first transistor E1 among the first through fourth transistors E1, E2, E3, E4.

Referring to FIG. 3A, the transistor-forming region B may include a pixel active region 14, a gate pattern 38, and a pixel conductive interconnection 73. The pixel active region 14 may have the photodiode PD of FIG. 2 on the left side of the gate pattern 38 on the figure. The pixel active region 14 may have a diffusion layer having a relatively smaller volume than the photodiode PD, on the right side of the gate pattern 38 on the figure. The gate pattern 38 may control the flow of electric charges stored in the photodiode PD.

The pixel conductive interconnection 73 may be electrically connected with the gate pattern 38 through a contact hole 66. The pixel conductive interconnection 73 may correspond to the circuit line L3 electrically connected to the first transistor E1 of FIG. 2. To simplify description of the embodiments, attention will also be paid to pad-forming regions C of FIG. 1 and FIG. 3B of the peripheral region 139 along with the transistor-forming regions B. Each pad-forming region C may include a peripheral active region 18, first, second and third conductive interconnections 76, 84, 94, and a conductive pad 129.

In addition to the pad-forming regions C, a plurality of peripheral active regions 18 may be disposed in the internal circuit of the peripheral circuit region 139. The conductive pad 129 may be electrically connected with the first conductive interconnection 76 through a pad hole 119. The transistor-forming regions B and the pad-forming regions C may constitute the image sensor 140 according to the exemplary embodiments.

Next, a method of fabricating an image sensor according to an exemplary embodiment will be described.

FIGS. 4A, 5A, 6A, 7A and 8A are cross-sectional views illustrating a method of fabricating an image sensor, taken along lines I-I' of FIG. 3A. FIGS. 4B, 5B, 6B, 7B and 8B are cross-sectional views illustrating a method of fabricating an image sensor, taken along lines and II-II' of FIG. 3B.

Figure 4A:
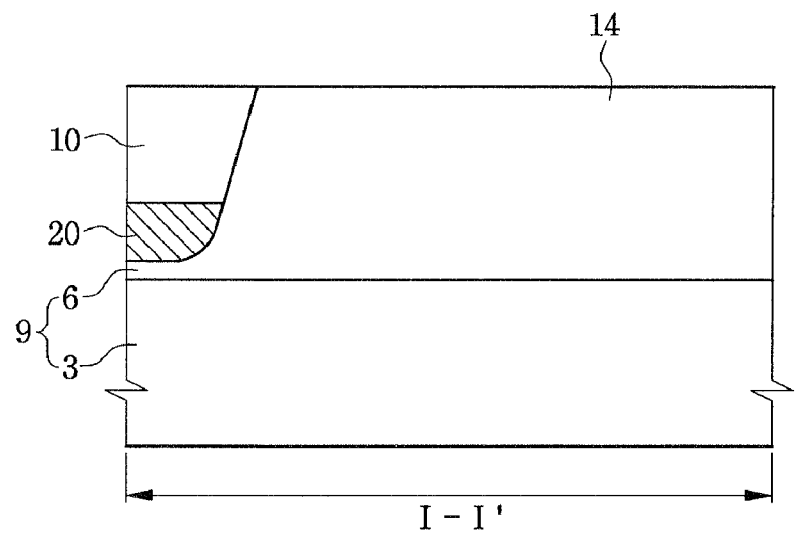
FIGS. 4A, 5A, 6A, 7A and 8A are cross-sectional views illustrating a method of fabricating an image sensor, taken along lines I-I' of FIG. 3A.
Figure 4B:
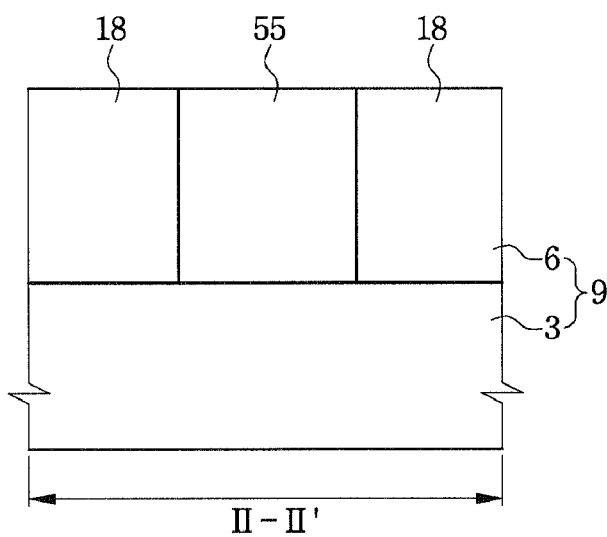
FIGS. 4B, 5B, 6B, 7B and 8B are cross-sectional views illustrating a method of fabricating an image sensor, taken along lines II-II' of FIG. 3B.

Referring to FIGS. 4A and 4B, a device isolation region 10 may be formed in a semiconductor substrate 9. The device isolation region 10 may be formed in the pixel array region 133 and the peripheral circuit region 136, 139 of FIG. 1. The device isolation region 10 may define a pixel region A plurally in the pixel array region 133. To this end, the device isolation region 10 may be formed such that the pixel region A corresponds to a pixel active region 14.

Each pixel active region 14 may be formed along the second, third and fourth transistors E2, E3, E4 of FIG. 2. The device isolation region 10 may define a peripheral active region 18 plurally in the peripheral circuit region. To this end, the peripheral active region 18 may be formed in the optical black region 136. The peripheral active region 18 of the optical black region 136 may have a shape equal to or different from the pixel active region 14 of the pixel array region 133.

The peripheral active region 18 may be formed plurally in the internal circuit of the peripheral region 139 of FIG. 1. Thereby, the peripheral active region 18 may be formed in the pad-forming region C. The semiconductor substrate 9 may include a first substrate 3 and a second substrate 6 stacked thereon. The first and second substrates 3, 6 may include single crystalline silicon. The first and second substrates 3, 6 may have n-type or p-type conductivity.

A dose of impurity ions of the first substrate 3 may be greater in size than that of the second substrate 6. Thus, the first and second substrates 3, 6 may have different etch rates in a selected etching process to be performed in the later. The pixel active region 14 and the peripheral active region 18 may be formed on the second substrate 6. Subsequently, a first diffusion layer 20 may be formed under the device isolation region 10 of the pixel array region 133.

The first diffusion layer 20 may electrically isolate the pixel active region 14 from a neighboring pixel active region 14. The first diffusion layer 20 may be formed under the device isolation region 10 of the optical black region 136. The first diffusion layer 20 may also be formed in a portion region under the device isolation region 10 of the peripheral region 139. A second diffusion layer (not shown) may be formed in the remaining region under the device isolation region 10 of the peripheral region 139. Thus, the peripheral active region 18 may be electrically isolated through the first diffusion layer 20 or the second diffusion layer from a neighboring peripheral active region 18.

In more detail, the first diffusion layer 20 and the second diffusion layer may electrically isolate bulk bodies of the nMOS and pMOS transistors in the pixel array region 133 and the peripheral circuit region 136, 139. Impurity ions of the first diffusion layer 20 may have a conductivity different from impurity ions of the second diffusion layer. The impurity ions of the first diffusion layer 20 or the second diffusion layer may have a conductivity equal to or different from the impurity ions of the second substrate 6.

A pad region 55 may be formed in the peripheral active region 18 of the pad-forming region C. The pad region 55 may be formed using the first diffusion layer 20 and/or the second diffusion layer while the impurity ions are implanted into the pixel array region 133 and/or the peripheral circuit region 136, 139. The first diffusion layer 20 and the second diffusion layer may each be formed on the second substrate 6 through an ion implanting process, or photo and ion implanting processes.

The pad region 55 may be a trace of the impurity ions of the first diffusion layer 20 and/or the second diffusion layer on the second substrate 6. The first diffusion layer 20 may be formed under the device isolation region 10 and in the pixel active region 14. The second diffusion layer may be formed under the isolation layer 10 and in the peripheral active region 18. Further, a cell well diffusion layer (not shown) may be formed in the pixel array region 133 and the optical black region 136.

The cell well diffusion layer may be formed on a part of the peripheral region 139. The cell well diffusion layer may be formed under the first diffusion layer 20 and the second diffusion layer. Thereby, the cell well diffusion layer may protect the pixel array region 133, the optical black region 136, and the part of the peripheral region 139 from internal and external electrical shocks of the semiconductor substrate 9. A peripheral well diffusion layer (not shown) may be formed in the remaining part of the peripheral region 139.

The peripheral well diffusion layer may be formed under the first diffusion layer 20 and the second diffusion layer. Thereby, the peripheral well diffusion layer may protect the remaining part of the peripheral region 139 from internal and external electrical shocks of the semiconductor substrate 9. Impurity ions of the cell well diffusion layer may have a conductivity different from impurity ions of the peripheral well diffusion layer. The cell well diffusion layer and/or the peripheral well diffusion layer may be formed on the pad region 55 of the pad-forming region C. The cell and peripheral diffusion layers may each be formed on the second substrate 6 through an ion implanting process, or photo and ion implanting processes.

Figure 5A:
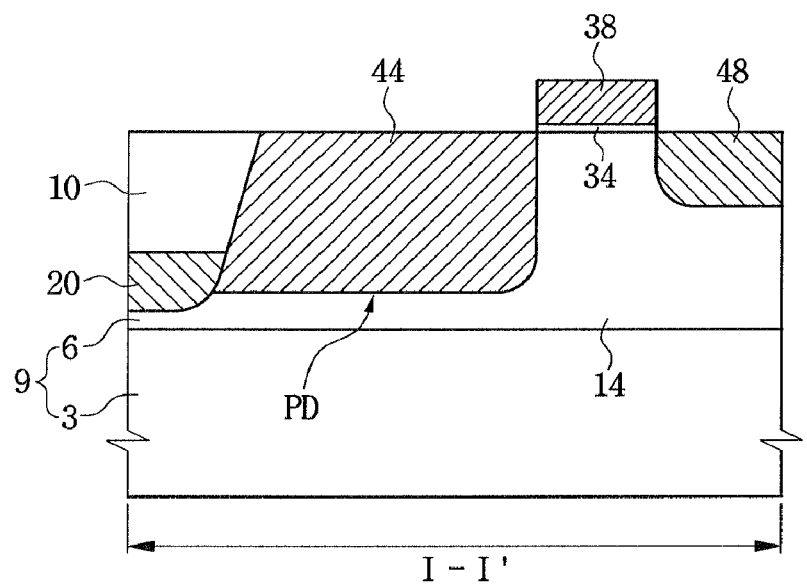
Figure 5B:
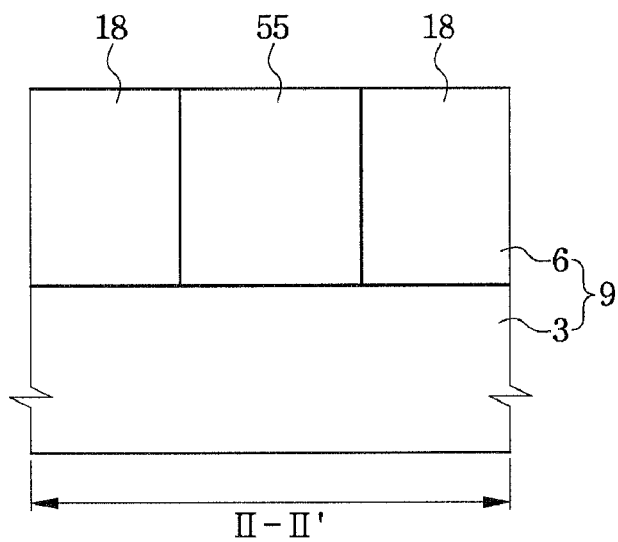

Referring to FIGS. 5A and 5B, a gate pattern 38 may be formed plurally in the pixel array region 133. The gate pattern 38 may be formed on the pixel active region 14 of the pixel region A. The gate pattern 38 may be formed corresponding to each of the second, third and fourth transistors E2, E3, E4 in the pixel active region 14. In addition, the gate pattern 38 may be formed corresponding to the internal circuits of the peripheral circuit region 136, 139.

The gate pattern 38 may include doped polysilicon, metal, metal silicide, or a combination thereof. A gate insulating pattern 34 may be formed under the gate pattern 38. The gate insulating pattern 34 may include silicon oxide, silicon nitride, metal nitride, metal oxide or a combination thereof. Third and fourth diffusion layers 44, 48 may be formed in the pixel array region 133 and the optical black region 136.

In the case where the pixel active region 14 of the pixel region A has the same shape as the peripheral active region 18 of the optical black region 136, the third diffusion layer 44 may be formed on the pixel active region 14 of the pixel region A and the peripheral active region 18 of the optical black region 136 to be located on one side of the gate pattern 38. The third diffusion layer 44 may be a photo diode PD. The third diffusion layer 44 may include impurity ions that are equal or different in conductivity.

In a case where the third diffusion layer 44 includes the impurity ions having one selected type of conductivity, the third diffusion layer 44 may have a conductivity different from the first diffusion layer 20 and the second substrate 6. The third diffusion layer 44 may have the same conductivity as the second diffusion layer. In a case where the third diffusion layer 44 includes the impurity ions of different conductivity types, the third diffusion layer 44 may partially have the same conductivity as the first diffusion layer 20 and the second substrate 6. The remaining part of the third diffusion layer 44 may have the same conductivity as the second diffusion layer.

Further, in a case where the pixel active region 14 of each pixel region A has the same shape as the peripheral active region 18 of the optical black region 136, the fourth diffusion layer 48 may be formed on the pixel active region 14 of each pixel region A and the peripheral active region 18 of the optical black region 136 to be located on the other side of the gate pattern 38. The fourth diffusion layer 48 may be formed on opposite sides of each of the second, third and fourth transistors E2, E3, E4. The fourth diffusion layer 48 may be source and drain regions of each of the second, third and fourth transistors E2, E3, E4 in the pixel active region 14.

The fourth diffusion layer 48 may be formed on the peripheral active region 18 in a portion region of the peripheral region 139 to be located on the opposite sides of the gate pattern 38. The fourth diffusion layer 48 may be source and drain regions of a transistor at the portion region of the peripheral region 139. The fourth diffusion layer 48 may have the same conductivity as at least a part of the third diffusion layer 44. A fifth diffusion layer (not shown) may be formed on the peripheral active region 18 at the remaining region of the peripheral region 139 to be located on the opposite sides of the gate pattern 38.

The fifth diffusion layer may be source and drain regions of a transistor at the remaining region of the peripheral region 139. The fifth diffusion layer may include impurity ions having a conductivity different from the fourth diffusion layer 48. The third diffusion layers 44, the fourth diffusion layers 48, and the fifth diffusion layer may be formed on the second substrate 6 through photo and ion implanting processes. The third diffusion layers 44, the fourth diffusion layers 48, and/or the fifth diffusion layer may be formed in the pad region 55 of the pad-forming region C.

Before the gate pattern 38 is formed on the semiconductor substrate 9, cell and peripheral threshold adjustment diffusion layers (not shown) may be formed in the pixel array region 133 and the peripheral circuit region 136, 139. The cell and peripheral threshold adjustment diffusion layers may be formed under main surfaces of the pixel and peripheral active regions 14, 18. The pad region 55 may have the cell threshold adjustment diffusion layer and/or the peripheral threshold adjustment diffusion layer.

After the fifth diffusion layer is formed, the pad region 55 may be formed to be in contact with the first substrate 3 through the second substrate 6. A dose of impurity ions of the pad region 55 may be greater in size than that of the second substrate 6. Thus, the pad region 55 and the second substrate 6 may have different etch rates in a selected etching process to be performed in the later.

Figure 6A:
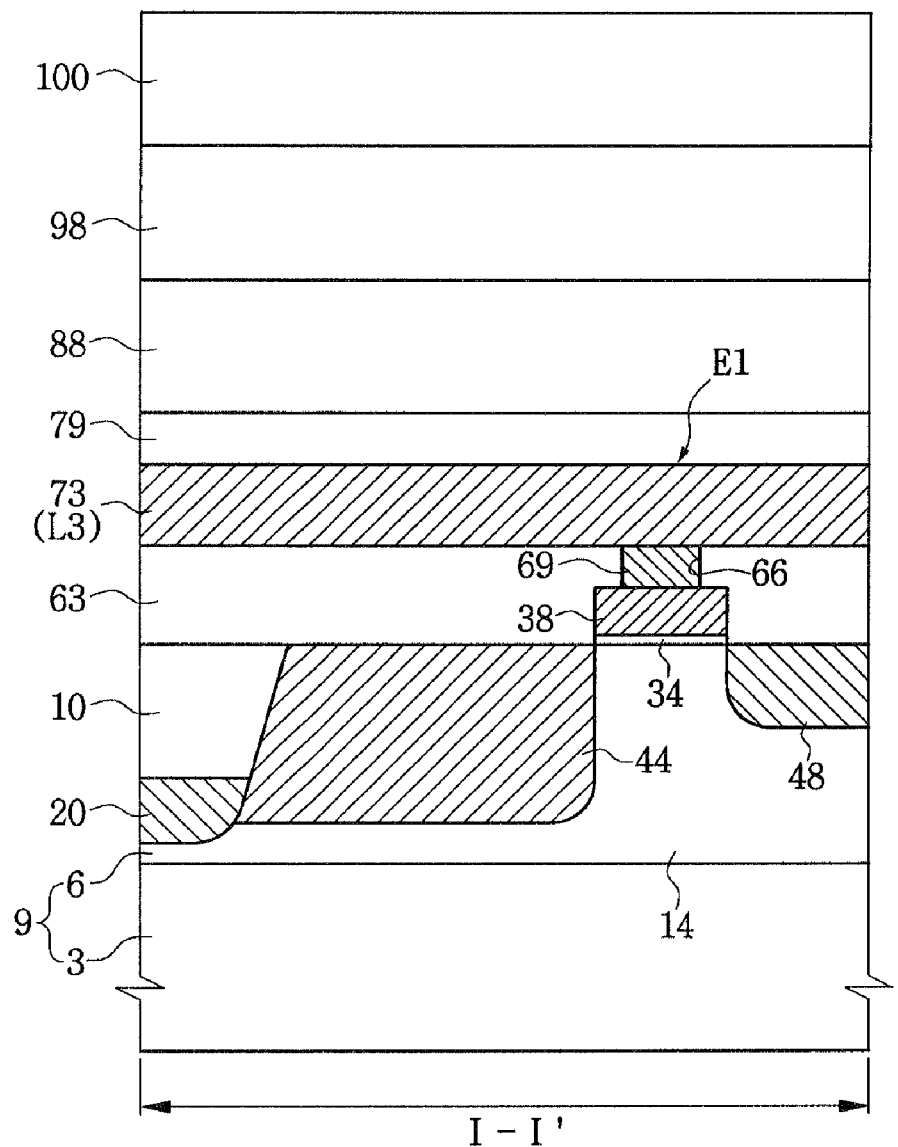
Figure 6B:
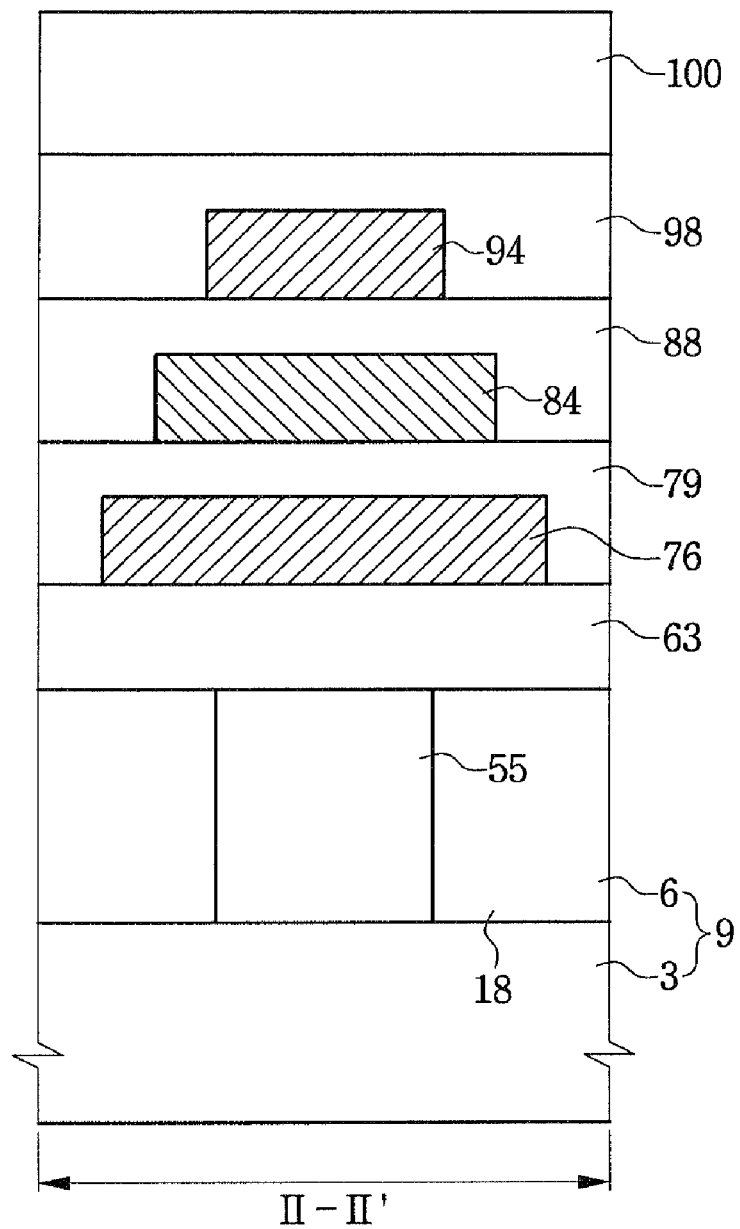

Referring to FIGS. 6A and 6B, a first insulating layer 63 may be formed in the pixel array region 133 and the peripheral circuit region 136, 139. In this case, the first insulating layer 63 may be formed on the gate pattern 38 of the pixel active region 14 and on the pad region 55 of the pad-forming region C. The first insulating layer 63 may include insulating material having an etch rate different from the gate pattern 38. The first insulating layer 63 may be partially removed to form a contact hole 66.

The contact hole 66 may be fowled to expose the gate pattern 38. The contact hole 66 may be formed through photo and etching processes. A contact plug 69 may be formed in the contact hole 66. The contact plug 69 may include conductive material. The contact plug 69 may be formed through deposition and etching processes. A pixel conductive interconnection L3 or 73 may be formed on the first insulating layer 63 to be in contact with the contact plug 69.

The pixel conductive interconnection 73 may constitute the first transistor E1 of FIG. 2 in combination with the gate pattern 38 and the third and fourth diffusion layers 44, 48. A first conductive interconnection 76 may be formed on the first insulating layer 63 of the pad-forming region C. Second, third and fourth insulating layers 79, 88, 98 may be formed in the pixel array region 133 and the peripheral circuit region 136, 139. The second, third and fourth insulating layers 79, 88, 98 may be located on the first insulating layer 63 to cover the pixel conductive interconnection 73 and the first conductive interconnection 76.

The second, third and fourth insulating layers 79, 88, 98 may include insulating material having an etch rate equal to or different from the first insulating layer 63. The second, third and fourth insulating layers 79, 88, 98 may have different etch rates from one another. The second, third and fourth insulating layers 79, 88, 98 may each be formed through a deposition process. The third and fourth insulating layers 88, 98 may be formed to have second and third conductive interconnections 84, 94. The pixel conductive interconnection 73 may be formed of one selected from aluminum and copper, together with the first, second and third conductive interconnections 76, 84, 94.

A lower portion and/or an upper portion of the pixel conductive interconnection 73 and the first, second and third conductive interconnections 76, 84, 94 may include metal, metal nitride or a combination thereof. The pixel conductive interconnection 73 and the first, second and third conductive interconnections 76, 84, 94 may each be formed through deposition, photo and etching processes. Subsequently, a support substrate 100 may be formed on the fourth insulating layer 98. The support substrate 100 may be formed to cover the pixel array region 133 and the peripheral circuit region 136, 139.

The support substrate 100 may include single crystalline silicon, polycrystalline silicon, amorphous silicon or a combination thereof.

Figure 7A:
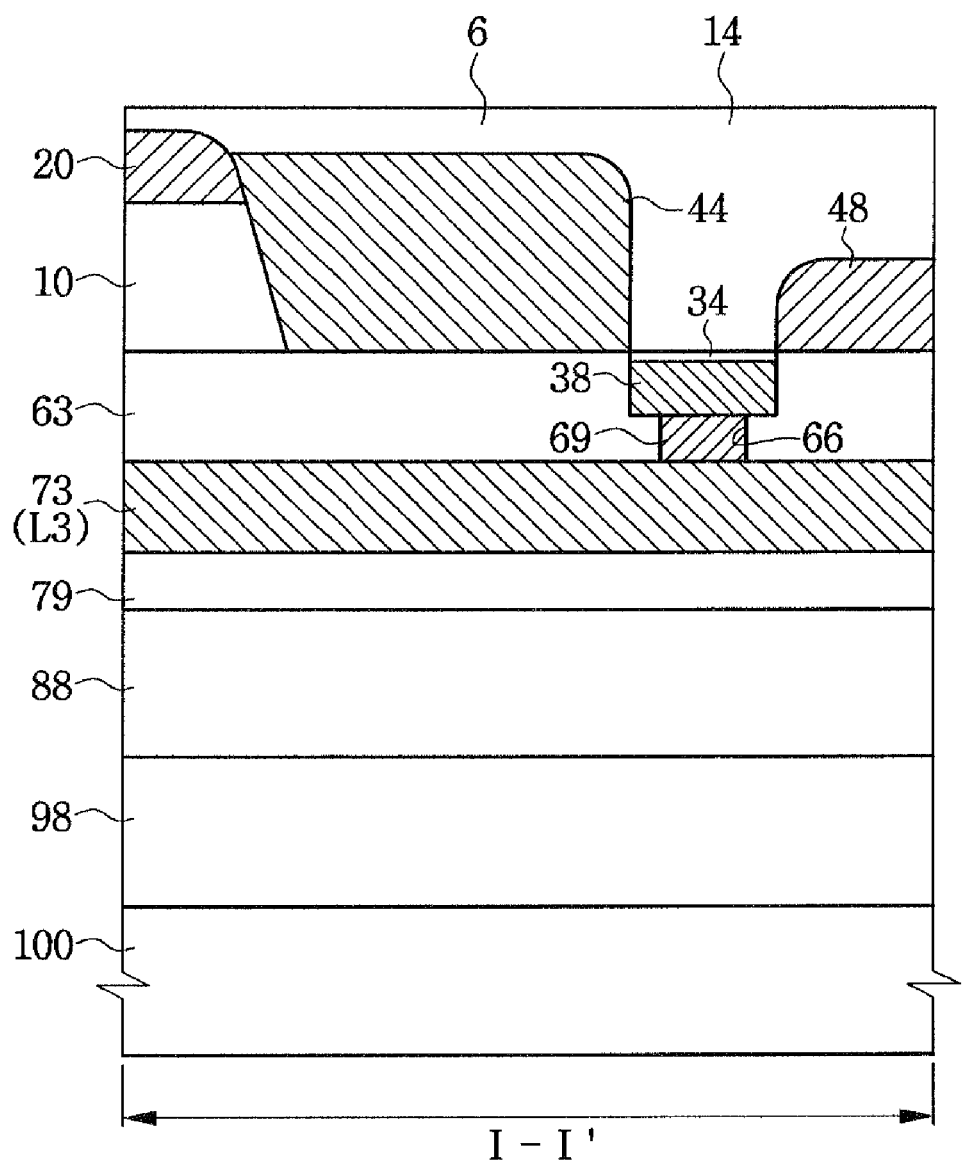
Figure 7B:
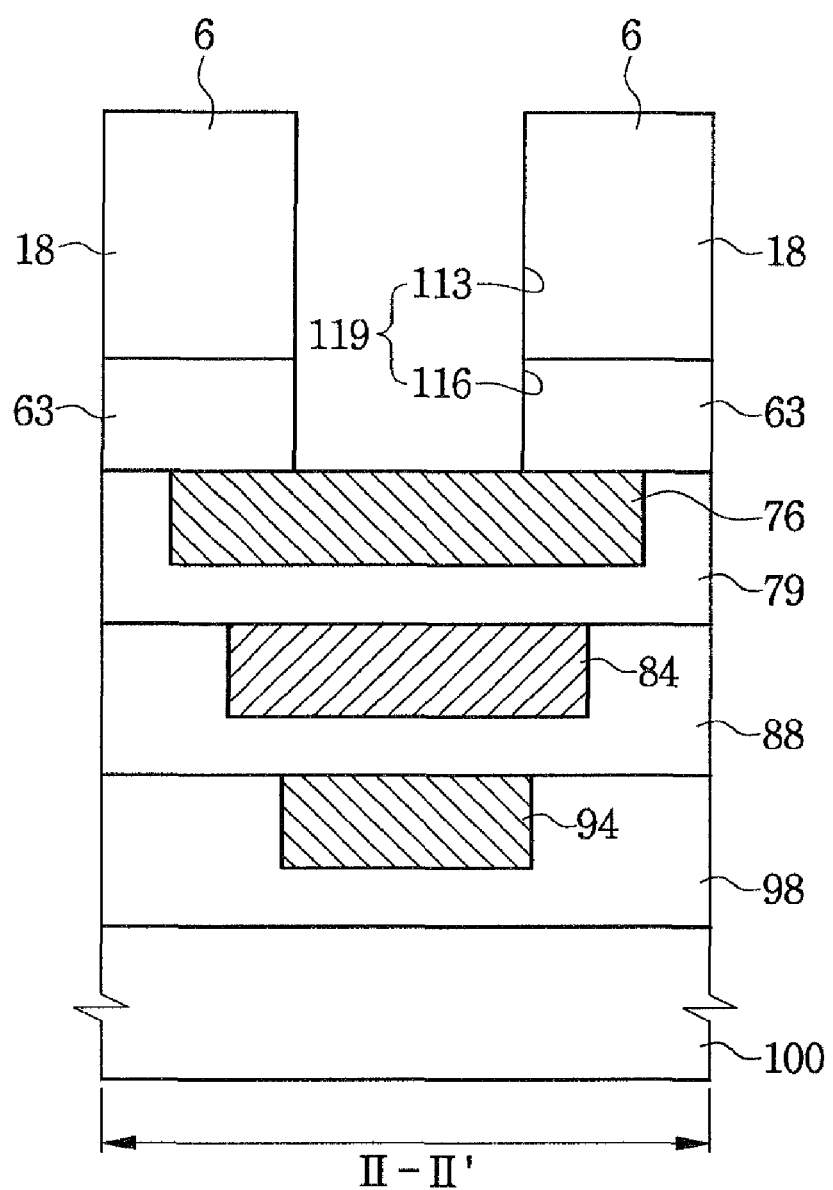

Referring to FIGS. 7A and 7B, the semiconductor substrate 9 of FIGS. 6A and 6B may be inverted such that the semiconductor substrate 9 and the support substrate 100 are directed to the top and bottom, respectively. A planarization process may be performed on the semiconductor substrate 9. The planarization process may be performed to remove the first substrate 3 to expose the second substrate 6. The planarization process may be performed using one selected from chemical mechanical polishing, etching back, and isotropic etching. A wet etching process may be performed on the second substrate 6.

The wet etching process may be performed using the second substrate 6 as an etch mask to remove semiconductor material in the pad region 55 of the pad-forming region C. The semiconductor material may include silicon and impurity ions bonded with the silicon. The wet etching process may be performed using a wet etchant including hydrofluoric acid (HF), nitric acid ($HNO_3$) and acetic acid ($CH_3COOH$). The wet etchant may have the following etch rate with respect to the semiconductor material depending on kind and concentration of the impurity ions as in a table below.

| Comparison Table of Etched Silicon Quantity Depending on Doping Concentration | | |
|---|---|---|
| Kind of Impurity Ions | Concentration (atoms/cm$^2$) | Etch Rate (µm/min) |
| Boron | 7 × 10E18 or more | 2.0 |
|  | 3 × 10E17 or less | 0.02 |
| Phosphorus | 8 × 10E18 or more | 2.9 |
|  | 5 × 10E17 or less | 0.16 |

In exemplary embodiments, the wet etchant also shows the etch rate as in the comparison table above with respect to values of concentration of the impurity ions including boron and phosphorus in the pad region C. By referring to the comparison table, the concentration values of the impurity ions of the diffusion layers in the pad region C may be properly selected for the pad-forming region C. Thus, the wet etchant may react with the semiconductor material in the pad region C using the second substrate 6 as an etch buffer layer and/or an etch mask, thereby fanning a guide hole 113 in the second substrate 6 of the pad-forming region C.

The guide hole 113 may be formed in the second substrate 6 through the second substrate 6 to expose the first insulating layer 63. The first insulating layer 63 may be etched through the guide hole 113, thereby forming a connection hole 116 in the first insulating layer. The connection hole 116 may be formed to expose the first conductive interconnection 76. The connection hole 116 may be formed using the second substrate 6 as an etch mask through a wet etching process and/or a dry etching process. The connection hole 116 may serve as one pad hole 119 in combination with the guide hole 113. Thus, the pad hole 119 may be formed in self-alignment with a structure adjacent to the pad hole 119 without applying a photo process.

Figure 8A:
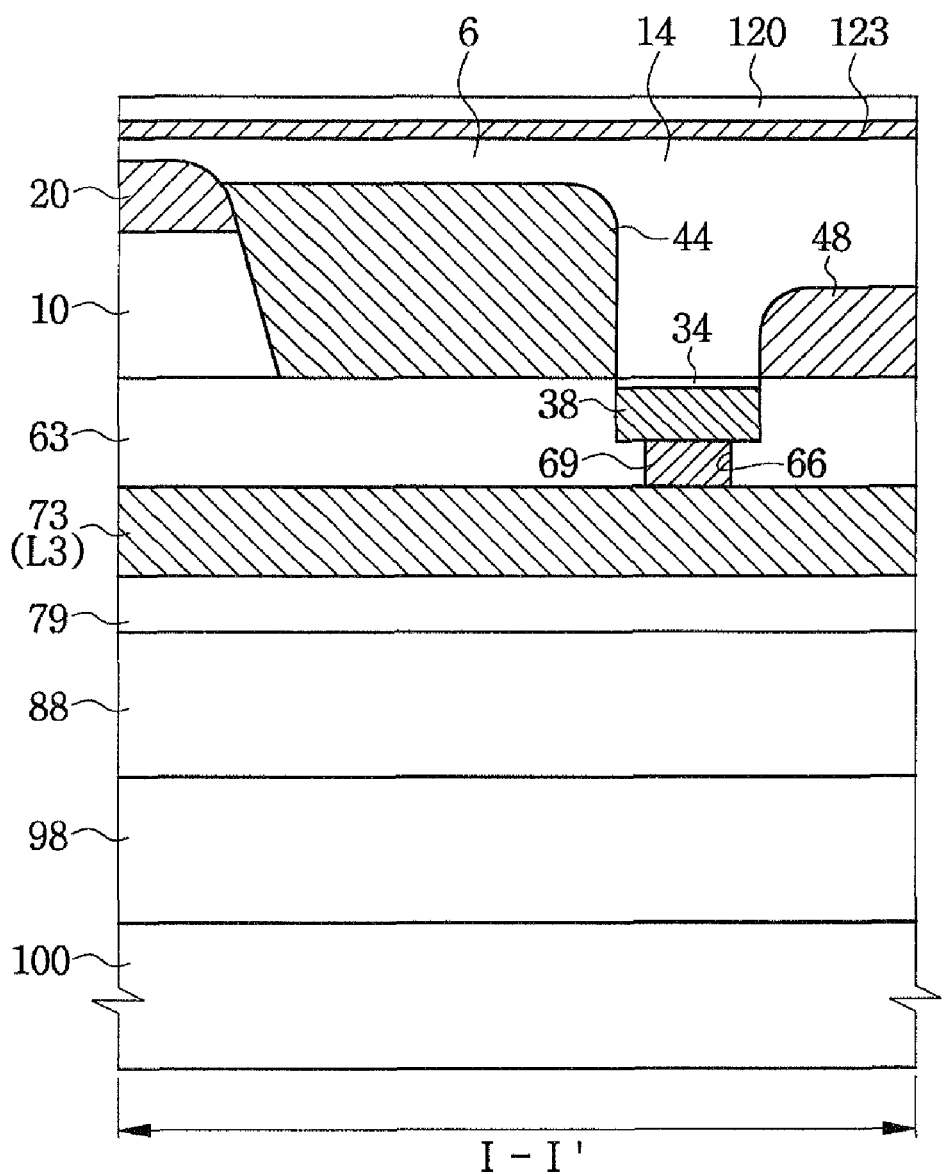
Figure 8B:
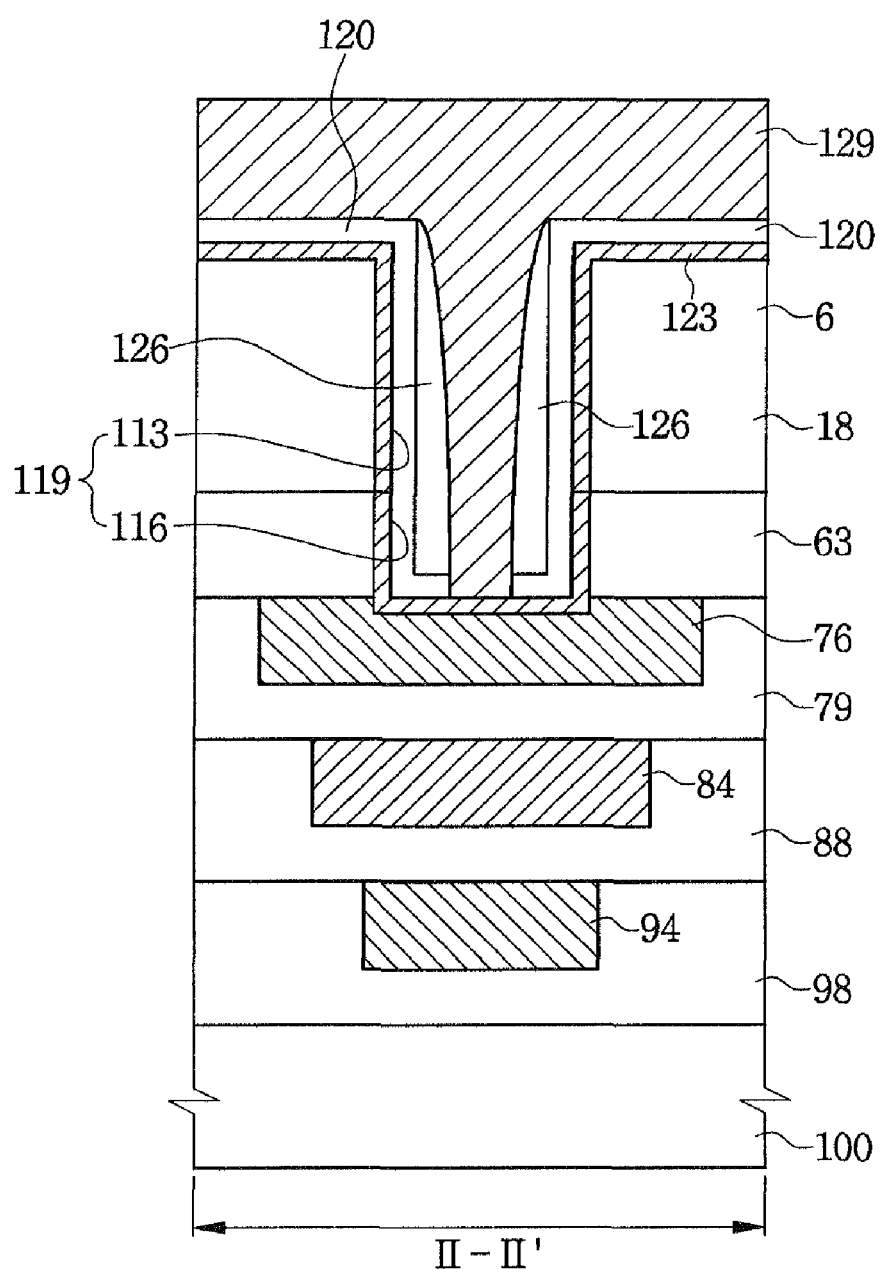

Referring to FIGS. 8A and 8B, the second substrate 6, the first insulating layer 63, and the first conductive interconnection 76 may be subjected to surface-etching treatment. The surface-etching treatment may be performed to remove an etch damaged layer in the second substrate 6 while the connection hole 116 is being formed. The surface-etching treatment may be performed through chemical mechanical polishing. Subsequently, an anti-reflection layer 120 may be formed on the second substrate 6 to conformally cover the pad hole 119.

The anti-reflection layer 120 may be formed on the pixel array region 133 and the peripheral circuit region 136, 139. The anti-reflection layer 120 may contribute to stabilizing semiconductor fabricating processes following the surface-etching treatment. The anti-reflection layer 120 may be formed through a deposition (or coating) process. Next, a sixth diffusion layer 123 may be formed in the second substrate 6, the first insulating layer 63, and the first conductive interconnection 76 through the anti-reflection layer 120. Impurity ions of the sixth diffusion layer 123 may have a conductivity equal to or different from the impurity ions of the second substrate 6.

The sixth diffusion layer 123 may be formed through an ion implanting process. The sixth diffusion layer 123 may contribute to minimizing electrical damage caused by electrons and holes that may be generated inside and around the PD. Next, an insulating spacer layer (not shown) may be formed on the anti-reflection layer 120 to conformally cover the pad hole 119. The insulating spacer layer may be foamed using insulating material having an etch rate equal to or different from the anti-reflection layer 120.

The insulating spacer layer may be formed through a deposition process. The insulating spacer layer and the anti-reflection layer 120 may be etched to expose the first conductive interconnection 76 and/or the sixth diffusion layer 123, thereby fowling an insulating spacer 126 surrounding sidewalls of the pad hole 119. After the insulating spacer 126 is formed, the anti-reflection layer 120 may be left in the pixel array region 133 and the peripheral circuit region 136, 139.

The anti-reflection layer 120 may be foamed through photo and etching processes to remain only on the pixel array region 133 and/or the optical black region 136. A conductive pad 129 may be formed to fill the pad hole 119 and be located on the anti-reflection layer around the pad hole 119. The conductive pad 129 may be formed to expose the pixel array region 133 and the optical black region 136. Thereby, the conductive pad 129 may be formed in the pad-forming region C of FIG. 1.

The conductive pad 129 may be formed through photo and etching processes. The conductive pad 129 may include aluminum or copper. Thus, the conductive pad 129 may constitute the image sensor 140 according to the exemplary embodiments in combination with the components of the pixel array region 133 and the peripheral circuit region 136, 139. Further, after the conductive pad 129 is formed, the semiconductor fabricating processes associated with the image sensor 140 may continue to be applied to the pixel array region 133 and the peripheral circuit region 136, 139.

According to exemplary embodiments, a method of fabricating an image sensor does not apply a photo process to a semiconductor substrate to define a pad hole in the semiconductor substrate. As such, the exemplary embodiments simplify the semiconductor fabricating processes, so that they can contribute to reducing the fabrication cost of the image sensor. In the exemplary embodiments, an image sensor having higher reliability than conventional image sensors can be provided through the method of fabricating the image sensor in accordance with the present application's inventive concept.

Although exemplary embodiments have been described, those skilled in the art will readily appreciate that many modifications are possible to the exemplary embodiments without materially departing from the present application's inventive concept. Therefore, it is to be understood that the foregoing is not to be construed as limited to the specific embodiments disclosed, and that modifications to the disclosed embodiments, as well as other embodiments, are intended to be included within the scope of the appended claims.

What is claimed is:

1. A method of fabricating an image sensor, comprising:
preparing a semiconductor substrate, the semiconductor substrate having a first substrate and a second substrate stacked sequentially, the first substrate and the second substrate each having conductivity;
forming a pad region on the semiconductor substrate, the pad region being in contact with the first substrate through a predetermined region of the second substrate, and impurity ions of the pad region having a concentration higher than impurity ions of the second substrate;
forming an insulating layer on the semiconductor substrate to cover the pad region;
selectively removing the first substrate from the semiconductor substrate; and
forming a pad hole in the second substrate and in the insulating layer such that the pad hole is aligned on the pad region of the second substrate.

2. The method according to claim 1, wherein the first substrate and the second substrate comprise impurity ions which have a conductivity type selected from the same conductivity type and from different conductivity types, and
the impurity ions of the first substrate have a concentration higher than the impurity ions of the second substrate.

3. The method according to claim 2, wherein:
the second substrate comprises a pixel array region and a peripheral circuit region, both of which have active regions, each of the active regions having a plurality of diffusion layers, each of which has impurity ions, and at least part of the impurity ions is disposed on the pad region;
the pad region is formed in the peripheral circuit region; and
the pixel array region comprises at least one photodiode.

4. The method according to claim 3, wherein selectively removing the first substrate comprises performing a planarization process on the semiconductor substrate to expose the second substrate through different etch rates from each other using concentration magnitude of the impurity ions of the first substrate and the second substrate, the planarization process being performed using one selected from chemical mechanical polishing, etching back, and isotropic etching.

5. The method according to claim 4, wherein:
the insulating layer comprises at least one conductive interconnection; and
forming the pad hole comprises wet-etching the pad region using the second substrate as an etch mask and/or an etch buffer layer to form a guide hole exposing the insulating layer, and partially etching the insulating layer using the second substrate as the etch mask to form a connection hole exposing the at least one conductive interconnection.

6. The method according to claim 5, further comprising:
performing surface-etching treatment on the second substrate, the insulating layer, and the at least one conductive interconnection;
forming an anti-reflection layer on the second substrate to conformally cover the pad hole; and
forming a diffusion layer of n-type conductivity or p-type conductivity on the second substrate, the insulating layer, and the at least one conductive interconnection to be located under the anti-reflection layer.

7. The method according to claim 6, further comprising:
forming an insulating spacer layer on the anti-reflection layer to conformally cover the pad hole;
etching the insulating spacer layer and the anti-reflection layer to form an insulating spacer surrounding a sidewall of the pad hole and expose the at least one conductive interconnection; and
forming a conductive pad to fill the pad hole and cover the periphery of the pad hole.

* * * * *